(12) United States Patent
Huang et al.

(10) Patent No.: US 6,294,966 B1
(45) Date of Patent: Sep. 25, 2001

(54) INTERCONNECTION DEVICE

(75) Inventors: River Guanghua Huang; Parker Chandler, both of Prior Lake, MN (US)

(73) Assignee: HEI, Inc., Victoria, MN (US)

( * ) Notice: Subject to any disclaimer, the term of this patent is extended or adjusted under 35 U.S.C. 154(b) by 0 days.

(21) Appl. No.: 09/477,048

(22) Filed: Dec. 31, 1999

(51) Int. Cl.[7] .................................. H01L 23/043
(52) U.S. Cl. ....................... 333/33; 333/247; 257/728
(58) Field of Search ........................... 333/246, 247, 333/260, 33; 257/728

(56) References Cited

U.S. PATENT DOCUMENTS

| 4,890,155 | 12/1989 | Miyagawa et al. | 174/52.4 |
| 5,313,693 | 5/1994 | Cachier | 257/701 |
| 5,528,074 | * 6/1996 | Goto et al. | 257/664 |
| 5,982,250 | * 11/1999 | Hung et al. | 333/26 |
| 6,118,357 | * 8/2000 | Tomasevic et al. | 333/247 |
| 6,175,287 | * 1/2001 | Lampen et al. | 333/247 |
| 6,201,454 | 3/2001 | Kinayman et al. | 333/33 |

FOREIGN PATENT DOCUMENTS

| 0718905-A1 | * 6/1996 | (EP) . |
| 63124102 | 11/1989 | (JP) . |
| WO 99/27646 | 6/1999 | (WO) . |

* cited by examiner

Primary Examiner—Benny T. Lee
Assistant Examiner—Stephen E. Jones
(74) Attorney, Agent, or Firm—Merchant & Gould P.C.

(57) ABSTRACT

An RF microcircuit package and interconnection device is disclosed which minimizes impedance mismatch between circuit elements. Multiple signal vie and close proximity ground vies as well as tuned wire bonds are disclosed.

12 Claims, 3 Drawing Sheets

INTERCONNECTION DEVICE

FIELD OF THE INVENTION

The present invention relates to a "package" for the assembly of microelectronic circuitry and more particularly to methods, techniques and devices for routing and coupling RF signals between discrete components and substrates within the package.

BACKGROUND OF THE INVENTION

Microcircuit electronic products are typically assembled from individual components assembled into "packages". In practice individual components are "picked" and "placed" on a substrate. Substrates may be flexible polymer films or rigid ceramic pieces. Substrates may have multiple layers of circuit traces with interconnections between layers made in the "Z" direction through vies. Some components can be directly electrically attached to pads on the substrate with solder or adhesive or the like. Other components have connection pads that do not lie in the plane of the surface of the substrate. To accommodate the "height" of these pads, a technique such as wire bonding is used to route signals between the pads that lie in different planes.

For example it has been common practice to glue or solder integrated circuits to a ceramic substrate and then to make circuit interconnections with "wire bonds" between pads on the integrated circuit (IC) and a pad on the substrate. The "wire bond" is a small loop of wire that leaves the pad on the IC and loops over the edge of the IC and drops to the surface of the substrate. Wire bonds are rapidly stitched onto the IC during production and a typical throughput is 5 wire bonds per second. Both vie and wire bonds form acceptable signal paths for the package as long as the signal of interest is "low frequency".

However, wire bonds both attenuate and radiate signals in the low gigahertz range. The wire itself has a parasitic inductance, which becomes a significant circuit element in the gigahertz range. The conventional solutions to reducing the attenuation have included both "wedge" bonding and "ribbon bonding". Both of these techniques are efforts to reduce the length of the wire and therefore to reduce the inductance of the "wire".

In the wedge technique, the wire is routed at an acute angle off the pads to minimize the total length of the connection. Such connections can be made at a rate of approximately 2–3 bonds per second. Ribbon bonds substitute a flat ribbon wire for the conventional circular cross section wire of wire bonding. The ribbon has a parasitic capacitance, which is large with respect to the inductance, which minimizes attenuation. However successful ribbon wire bonding is critically dependent on component placement. This process is also extremely slow.

A similar signal routing problem arises on the substrate itself. In a multi-layered substrate linear signal traces typically lie close to a ground plane. As a consequence signal paths can be designed with a constant nominal impedance using well known "stripline" techniques for RF signals. However if the signal path departs from the stripline path and passes in the Z direction then the asymmetry creates an impedance mismatch with an associated attenuation and reflection. Ceramic substrates are particularly prone to this problem because they are brittle and additional thickness in the z-axis is required for mechanical strength. The increased thickness and high dielectric constant exacerbates the impedance mismatch problems.

Consequently there is a need for improved interconnection devices and methods for production of high performance high frequency circuitry "packages".

SUMMARY OF THE INVENTION

In contrast to the prior art, the present invention teaches a solution to the impedance mismatch problem within the substrate and at the surface of the substrate. In accordance with one principle of the invention, a capacitor is formed very near the bonding pad of the substrate. This capacitance forms a resonant circuit with the wire bond "wire". This circuit topology behaves like a transmission line with nominal characteristic impedance to couple signals with reduced attenuation and suppression of reflected and radiated energy.

In a second teaching of the invention two or more vie are supplied for the transmission of Z direction RF signals. In operation the mutual capacitance of the parallel vies form a transmission line for the signal. In an alternate form a ground via is placed near the signal via to form a transmission line like connection. These various principles may be used alone or combined to create high performance packages.

Several benefits flow from package construction that incorporates the techniques. Low loss connections allows for repartitioning of RF signal processing elements to achieve lower cost or higher performance. For example, it may be possible to use discrete circuit elements rather than integrated circuit elements in some instances where the absence of "good" interconnection technology would force the use of lower performance integrated circuit elements. The connection methodology is also tolerant of component placement which implies lower production costs. These techniques also allow the production of high performance RF packages using lower cost conventional production equipment, which implies lower costs as well.

BRIEF DESCRIPTION OF THE DRAWINGS

Throughout the several views of the drawings the invention is shown in several illustrative embodiments to depict various aspects and features of the invention wherein.

DETAILED DESCRIPTION

The disclosure is based on performance testing and a brief discussion of the testing methods is offered to clarify the disclosure. In general, a device under test is provided with an RF input port and an RF output port. The amount of radio frequency power injected into the circuit is taken as unity and the amount of power extracted is compared to the applied power to measure an "insertion loss". A low insertion loss corresponds to "better" performance. Reflected energy due to impedance mismatch also contributes to reduced performance. Return loss is a measure of this parameter. Return loss is conventionally measured as a negative number and so a higher value of return loss corresponds to better performance.

The measurements of return loss and insertion loss are functions of frequency and they are usually plotted against frequency. Broadband performance is highly desirable especially for newer digital phone technology where broad bandwidth is available.

Figure 1:
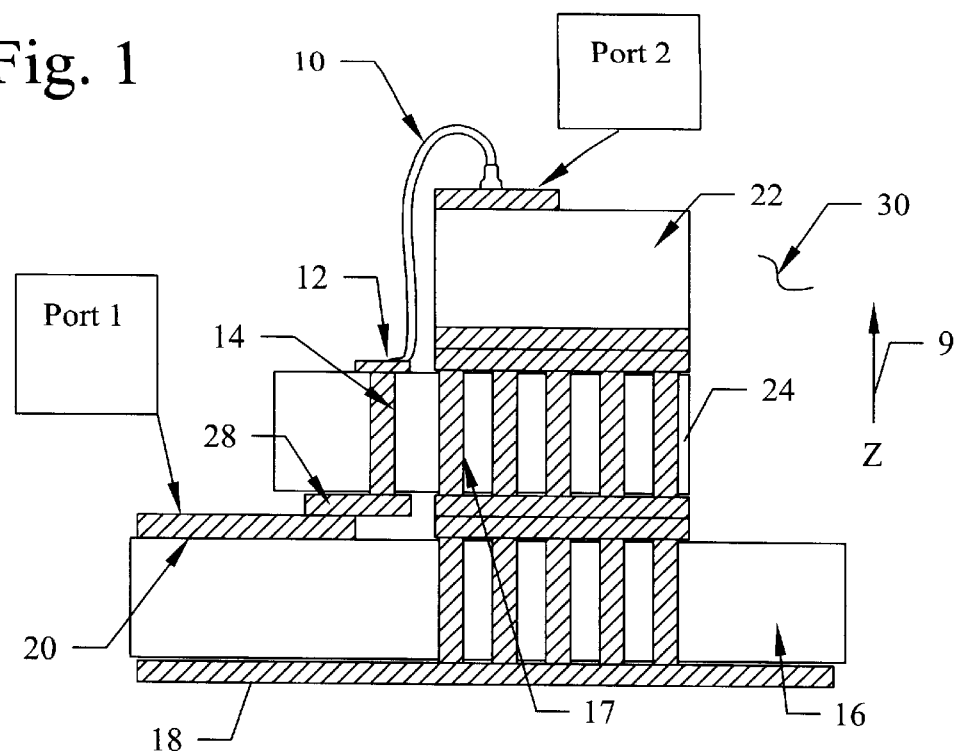
FIG. 1 is a cross section view of a package using aspects of the invention.

FIG. 1 shows a package 30 in cross section. The arrow 9 indicates the Z-axis in this figure. This package includes a substrate 16, which may be ceramic, or polymer and will typically be laminated with several layers of "circuits". For clarity only a one-layer structure is shown as substrate 16. As is typical of microwave practice the lower surface of the substrate is a ground plane 18 formed by a copper layer on the substrate 16. A single signal trace is developed on this substrate 16 by the transmission line formed by trace 20 and the ground plane 18. For any given substrate material and dielectric constant the proper width of the trace 20 can be easily computed, as is well known in this art. Trace 20 passes under and is bonded to a trace 28 on the lower surface of substrate 24. In a typical construction a ceramic substrate 24 may carry several integrated circuits or other discrete components which are interconnected to a ceramic or polymer laminate substrate 16 to make up a product.

In the construction shown in FIG. 1, the substrate 24 has many vias or vies that carry the ground plane to the underside of the integrated circuit 22. A first signal via 14 and a second via 15 (seen in FIG. 2) together form a signal path in the Z direction to take the signal from the transmission line 20 to the bonding area 12 on the upper surface of substrate 24. In contrast to prior art structures the RF signal is split between two vias seen as via 14 and via 15 in FIG. 1 and FIG. 2. The first signal via 14 and the second signal via are positioned near the ground via 17. The two signal vias and the companion ground vias taken together form a constant impedance connection in the Z-axis between the transmission line 20 and the bonding pad 12. It should be apparent that more than one additional ground via or signal via can be used to achieve the impedance match characteristic.

In FIG. 1 the wire 10 bond makes the electrical signal path connection from the bonding pad 12 to the port 2 connection to complete the description of the test package 30.

Figure 2:
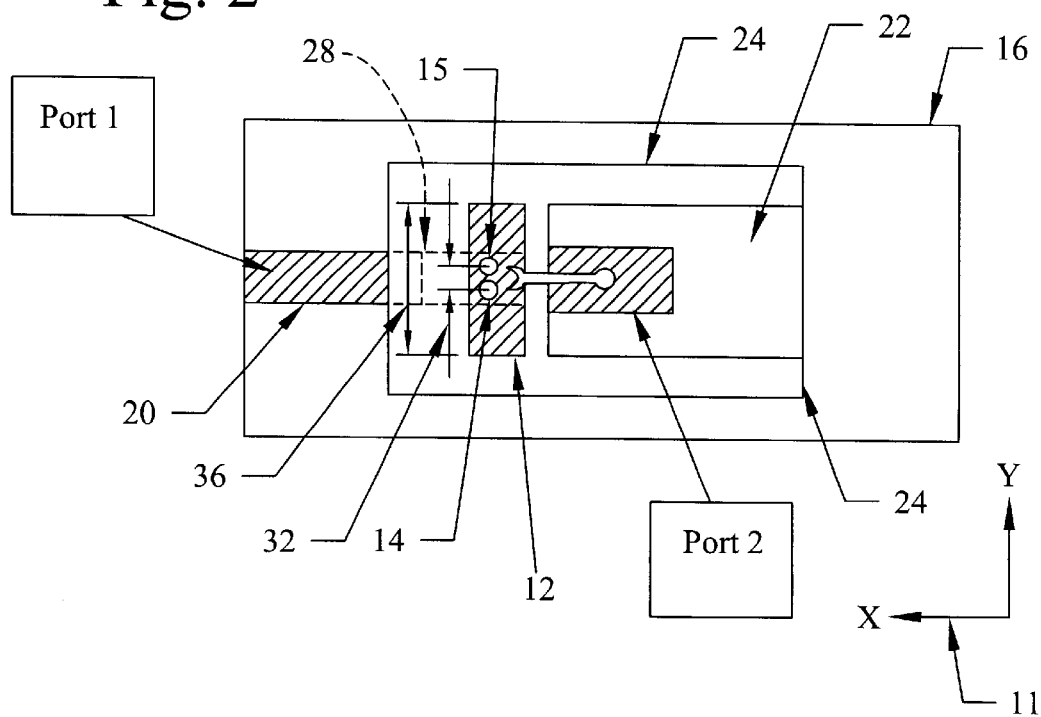
FIG. 2 is a plan view of a package using certain aspects of the invention.

FIG. 2 shows the arrangement of FIG. 1 in plan view. The arrow 11 identifies the X-Y axis for this configuration. The signal from port 1 enters the test package 30 through the transmission line connection formed by trace 20 and the ground plane 18 (not seen). This transmission line 20 is connected to trace 28. The connection trace 28 is shown in phantom view in this figure. This connection trace 28 couples with the first signal via 14 and via 15 is shown as separation distance 32. The magnitude of this separation distance can be used to "tune" the transmission line characteristics for the signal via.

On the upper surface of the substrate 24 the bonding pad 12 is shown with an exaggerated width labeled as 36 on FIG. 2. This extended bonding pad has substantial capacitance with respect to the ground planes of substrate 22 and substrate 24. It is the capacitance of the pad that "tunes" the inductance of the wire 10 to produce a characteristic design impedance. Although the pad is shown extended in the Y direction forming a "T" shaped connection it should be appreciated that other shapes are possible and potentially more desirable in particular situations. It is a characteristic of many RF integrated circuits that the density of interconnections is low and as a consequence the periphery of the die is available for such structures. It is also noted that the T shape takes advantage of the close ground plane a base or lower side of most integrated circuits. The equivalent circuit is a capacitor from the inductance of the wire to ground forming a pass band filter in the signal path.

With respect to the positioning distance 32 of the signal via 15 and the signal via 14, it should be understood that the exact spacing to create the desire characteristic impedance depends on the dielectric constant of the substrates 24 and 16 and the proximity of other ground features. Consequently, more than one signal via may be desirable given a specific package design. The shape and location of the vie should be considered illustrative of the invention rather than limiting. In a similar fashion, the ground via 17 which is a complement of the signal vie may be positioned to "tune" the connection. No exact relationship exists because of the proximity of other stray capacitance and proximity of other ground structures.

In the various tests, the RF signal is injected into port I and extracted from port 2. The power available at port 2 depends on the quality of the various connections between port 1 and port 2 and the tests measure the "return loss" and "insertion loss" between the ports. In general the two topologies shown in FIG. 1 and FIG. 2 were explored on composite test packages and the data is averaged for these tests. The use of Teflon filled ceramic substrates are preferred. It is believed that the increased dielectric constant of such material improves the performance of the techniques of the invention.

Figure 3:
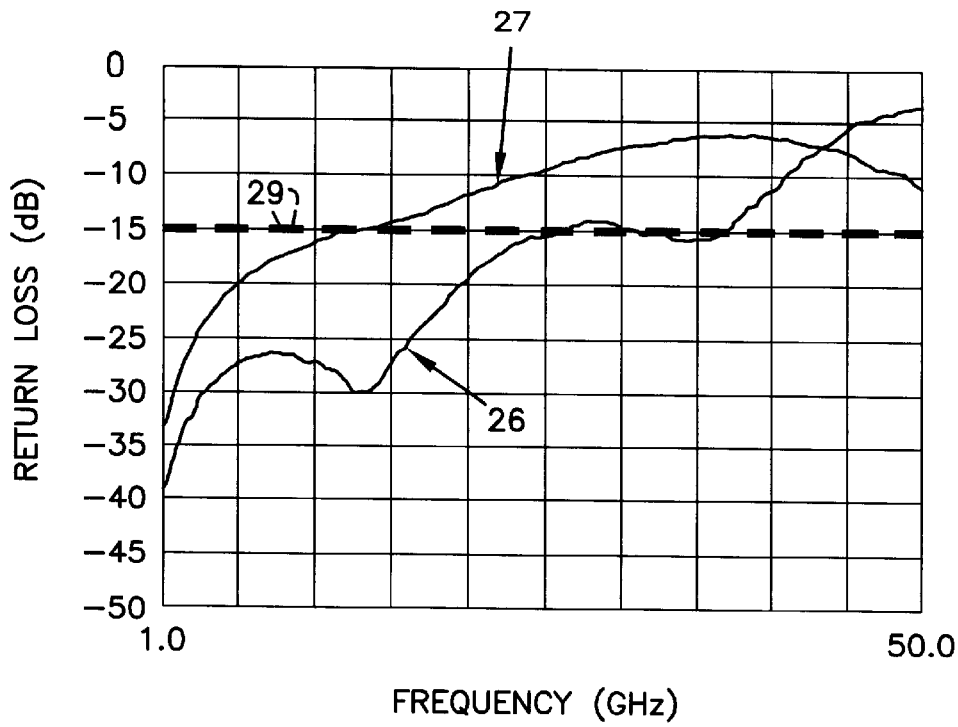
FIG. 3 is a graph showing return loss test results taken for prototype packages.

FIG. 3 shows the measured return loss of the package as line 26. This performance is compared to a similar package that does not practice the invention labeled 27 in the figure. The –15 dB line 29 is taken as the performance limit for comparison purposes. In general if the return loss is above –15 dB the signals are so degraded as to render the package impractical. The package of the invention does not reach the –15 dB point until approximately 36-gigahertz. By contrast the conventional technology reaches the –15 dB point at 13 GHz. Thus the package of the invention is capable of higher frequency operation. It is also important to note that the frequency range is very large which is a requirement for broadband operation.

Figure 4:
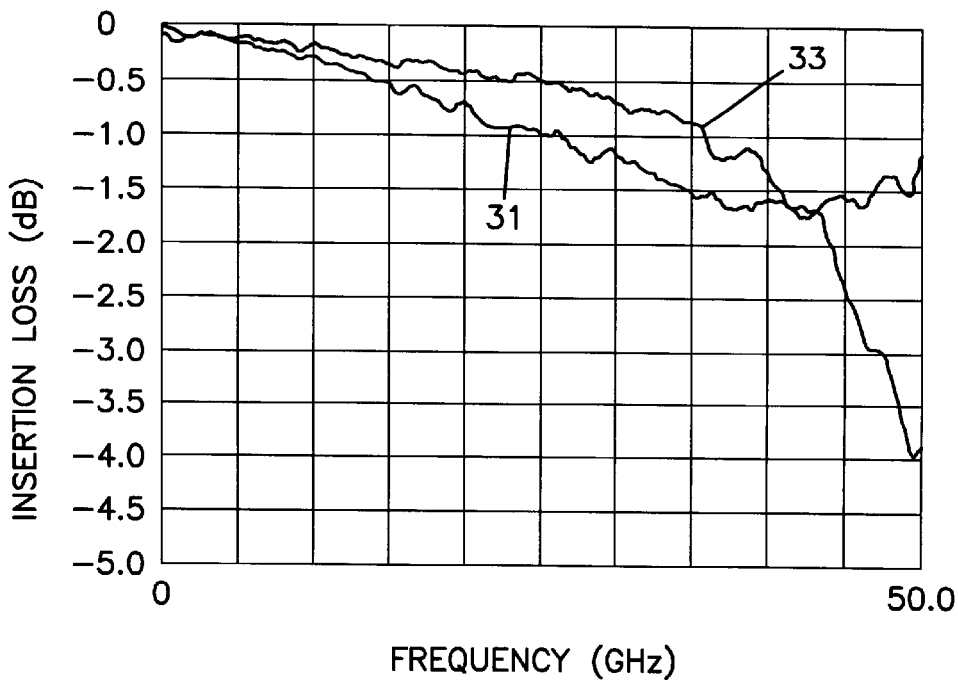
FIG. 4 is a graph showing insertion loss test results taken for prototype packages.

FIG. 4 sows the insertion loss characteristic for the package. The line 33 is taken with the test packages incorporating the invention while line 31 represents the results of the conventional technique. Line 33 lies above line 31 until about the 40 GHz point demonstrating lower insertion loss for the device. It is important to note that the figure shows that millimeter wavelength packages of the present invention attenuates the out of band noise more than the conventional package. This low insertion loss in the passband coupled with increased attenuation for out of passband energy is especially useful in high performance communication products such as cellular phones and the like.

Figure 5:
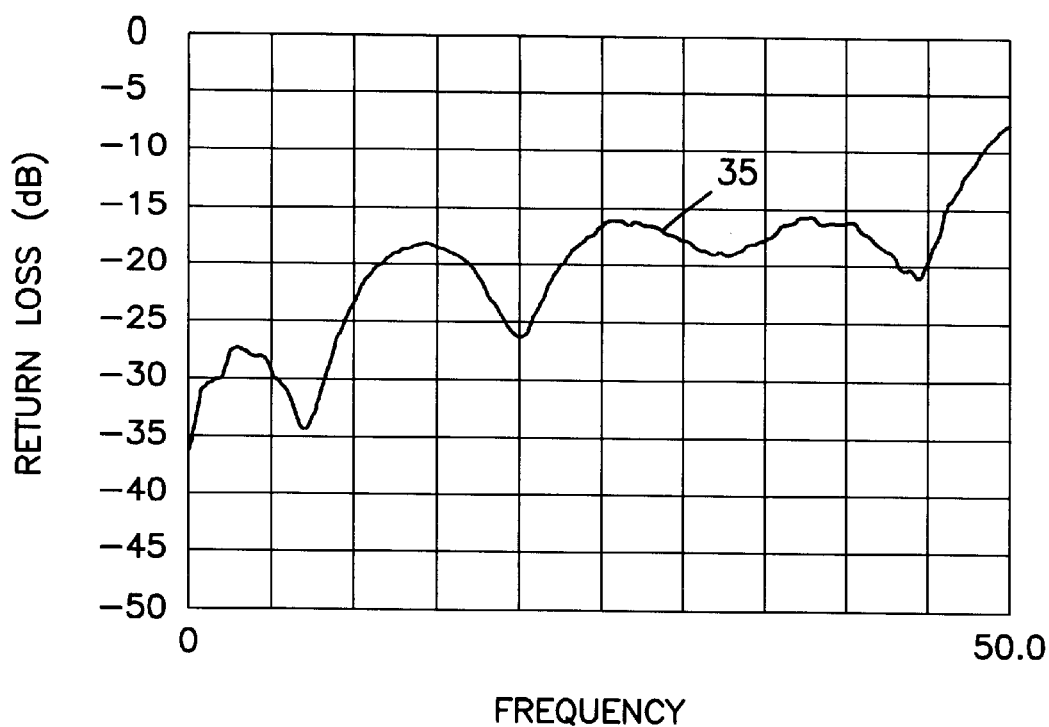
FIG. 5 is a graph showing performance of a package using laminate substrates.

FIG. 5 shows the result of a test package made with laminate substrates and Teflon filled ceramic material for a substrate. In this figure the package represented by line 35 offers superior performance in the millimeter wavelength range of 50 gigahertz.

Various embodiments of the invention are show together to make up a high performance RF package. However each concept may be used alone or combined with other techniques without departing from the scope of the invention. It should also be apparent that other modifications may be made without departing from the scope of the invention.

What is claimed is:

1. An interconnection device for use between a first pad on a first plane and a second pad on a second plane, comprising:
   a wire extending from said first pad to said second pad, said wire having an inductance and forming at least a portion of a signal path;

a capacitor located proximate said first pad and arranged to shunt said signal path, said capacitor having a capacitance, said capacitance and inductance providing said signal path formed with said wire with a designed characteristic impedance over a design bandwidth, wherein said designed characteristic impedance substantially matches an impedance of at least one other portion of said signal path at frequencies within said design bandwidth.

2. The interconnection device of claim 1 wherein said at least one wire is bonded to at least one of the first or second pads using a bond selected from the group consisting essentially of a wedge bond and a ribbon bond.

3. The interconnection device of claim 1 wherein said at least one wire has a substantially round cross section.

4. The interconnection device of claim 1 wherein said capacitor is formed as an extended area pad.

5. The interconnection device of claim 4 wherein said extended area pad has an extended width.

6. The interconnection device of claim 1 further comprising:

a substrate having a dielectric constant, a first side, and a second side, said second side being oppositely disposed from said first side, said first pad being formed on said first side of said substrate; and a ground plane formed on said second side of the substrate, wherein said capacitor is formed by said first pad and said ground plane.

7. The interconnection device of claim 6 wherein:

said design bandwidth includes at least some frequencies of about 30 GHz and higher; and a return loss between said first and second portions of said signal path is less than about −15 dB for frequencies within said design bandwidth.

8. The interconnection device of claim 1 wherein said at least one wire is a ribbon.

9. The interconnection device of claim 8 wherein said first and second end of the first conductor are connected to a common node and said first and second ends of the second ductor are connected to a common node.

10. An RF package comprising:

a first substrate having an RF signal path;

a substrate coupling pad connected to said RF signal path, said coupling pad lying on and substantially in the plane of said first substrate;

a component attached to said substrate;

said component having a second pad lying in a second component plane;

a wire connecting said first pad to said second pad, said wire exhibiting an inductance and forming a signal path; and a design capacitance associated with said pad and arranged to shunt said wire, whereby said capacitance and said inductance together provide characteristic impedance for said signal path formed with said wire so that said characteristic impedance of said wire matches the impedance of said RF signal path.

11. The RF package of claim 10 wherein said wire has a round cross-section.

12. The RF package of claim 10 wherein said wire has a rectangular cross-section.

* * * * *

UNITED STATES PATENT AND TRADEMARK OFFICE
CERTIFICATE OF CORRECTION

PATENT NO.    : 6,294,966 B1
DATED         : September 25, 2001
INVENTOR(S)   : Huang et al.

It is certified that error appears in the above-identified patent and that said Letters Patent is hereby corrected as shown below:

<u>Column 4,</u>
Line 14, "port I" should read -- port 1 --
Line 21, "substrates are" should read -- substrates is --

<u>Column 6,</u>
Line 9, "ductor" should read -- conductor --

Signed and Sealed this

Eighth Day of April, 2003

JAMES E. ROGAN
*Director of the United States Patent and Trademark Office*